(12) United States Patent
Chiba et al.

(10) Patent No.: US 8,845,134 B2
(45) Date of Patent: Sep. 30, 2014

(54) COOLING SYSTEM FOR LIGHT EMITTING DEVICE AND LIGHT EMITTING DEVICE USING THE SAME

(75) Inventors: Masaki Chiba, Tokyo (JP); Minoru Yoshikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 170 days.

(21) Appl. No.: 13/582,856

(22) PCT Filed: Mar. 2, 2011

(86) PCT No.: PCT/JP2011/054715
§ 371 (c)(1),
(2), (4) Date: Sep. 5, 2012

(87) PCT Pub. No.: WO2011/108571
PCT Pub. Date: Sep. 9, 2011

(65) Prior Publication Data
US 2013/0003393 A1 Jan. 3, 2013

(30) Foreign Application Priority Data

Mar. 5, 2010 (JP) .................. 2010-049047

(51) Int. Cl.
*F21V 29/00* (2006.01)
*H01L 33/64* (2010.01)
*F21V 31/00* (2006.01)
*H01L 33/52* (2010.01)
*H01L 25/16* (2006.01)

(52) U.S. Cl.
CPC ............ *H01L 33/642* (2013.01); *F21V 29/407* (2013.01); *F21V 29/262* (2013.01); *F21V 31/00* (2013.01); *H01L 25/167* (2013.01); *H01L 33/52* (2013.01)
USPC ....... 362/267; 362/294; 362/373; 362/249.02

(58) Field of Classification Search
CPC ... F21V 29/004; F21V 29/407; F21V 29/262; F21V 31/00; F21Y 2101/02; F25B 21/02; H01L 35/30
USPC ............................. 362/249.02, 294, 373, 267
See application file for complete search history.

(56) References Cited

U.S. PATENT DOCUMENTS 6,964,501 B2 * 11/2005 Ryan ............................. 362/294
7,736,041 B2 * 6/2010 Tronquet ....................... 362/547
(Continued)

FOREIGN PATENT DOCUMENTS

JP 2001-186967 7/2001
JP 2005-340392 12/2005
(Continued)

OTHER PUBLICATIONS
International Search Report, PCT/JP2011/054715, Apr. 19, 2011.

*Primary Examiner* — Peggy Neils
(74) *Attorney, Agent, or Firm* — Young & Thompson (57) ABSTRACT

An LED cooling system includes: hermetically sealed space 5 containing air and housing light emitting device 10 including light emitting body 1, the hermetically sealed space 5 including heat dissipation member 14 and cover film 11 having a double-layered structure; cooling element 4 contacting heat dissipation member 14 in hermetically sealed space 5, the cooling element 4 having a heat absorbing surface 4a absorbing heat from light emitting device 10 and heat dissipating surface 4b contacting heat dissipation member 14 to dissipate the heat absorbed by heat absorbing surface 4a through heat dissipation member 14; and metal plate 3 between light emitting device 10 and cooling element 4. Cover film 11 includes transparent resin film 12 outside hermetically sealed space 5, and metal film 13 located inside hermetically sealed space 5 and including opening 13a for exposing the light exit surface of light emitting body 1 through resin film 12.

20 Claims, 5 Drawing Sheets

(56) References Cited

U.S. PATENT DOCUMENTS

2004/0183172 A1* 9/2004 Saito et al. .................... 257/678
2009/0288808 A1* 11/2009 Chin ........................ 165/104.33

FOREIGN PATENT DOCUMENTS

| JP | 2006-093546 | 4/2006 |
|---|---|---|
| JP | 2006-140377 | 6/2006 |
| JP | 2007-149932 | 6/2007 |
| JP | 2007-258520 | 10/2007 |
| JP | 2008-020119 | 1/2008 |
| JP | 2009-064986 | 3/2009 |
| JP | 2009-513003 | 3/2009 |

* cited by examiner

COOLING SYSTEM FOR LIGHT EMITTING DEVICE AND LIGHT EMITTING DEVICE USING THE SAME

TECHNICAL FIELD

The present invention relates to a cooling system for a light emitting device, and a light emitting device using the same

BACKGROUND ART

Recently, advances have been occurred in the development of a projection type display device (LED projector) that uses a light emitting diode (LED) as a light source.

In the LED projector where high luminance is required, when luminance is approximately equal to that of a projector on which a halogen lamp is mounted, large current corresponding to the luminance must be supplied to the LED. This causes a great temperature increase in the area between the LED and the substrate on which the LED is mounted. Depending on the emission color of the LED, the electricity-to-light conversion efficiency of the LED is sensitive to temperature. Accordingly, when the temperature in the LED exceeds an ambient temperature (environmental temperature), there is a possibility that the luminance of the LED will be greatly reduced. In such a case, therefore, the LED must be cooled by using a cooling element such as a Peltier element.

When the LED is cooled by using the cooling element, it is desirable for the temperature of the cooling element to be lower than the ambient temperature. However, since this causes the occurrence of dew condensation, measures against this occurrence must be taken into consideration simultaneously with the use of the cooling element.

For example, Patent Literature 1 discloses a method for preventing the occurrence of dew condensation in a cooling device for an electronic device that includes a semiconductor light source including a LED. In this cooling device, a cooling object (LED) attached to the heat absorbing surface of the Peltier element is housed in a hermetically sealed space in which dry air is contained. By dissipating heat absorbed by the heat absorbing surface of the Peltier element from the heat dissipating surface of the Peltier element to the outside through a heat transfer component that defines the hermetically sealed space, the occurrence of dew condensation is prevented in the hermetically sealed space while the LED is simultaneously cooled.

CITATION LIST

Patent Literature

Patent Literature 1: JP 2007-258520 A

SUMMARY OF INVENTION

Problems to be Solved

However, in the aforementioned cooling device, when the device is miniaturized to narrow the hermetically sealed space, the surface of a hermetically sealed case, located on the light emitting surface side of the LED to define the hermetically sealed space together with the heat transfer component, is cooled. Dew condensation consequently occurs outside the hermetically sealed space, creating the possibility that electronic components located around the device will be short-circuited.

It is therefore an object of the present invention to provide a cooling system for a light emitting device that includes a light emitting body such as a LED, which can reduce the occurrence of dew condensation around the light emitting device while maintaining the light emitting body at a temperature that is lower than the temperature around the light emitting device.

Solution to Problems

To achieve the object, a cooling system for a light emitting device according to the present invention including a light emitting body comprises: a hermetically sealed space in which air is contained and in which the light emitting device is housed, the hermetically sealed space including a heat dissipation member and a cover film having a double-layered structure fixed to the heat dissipation member; a cooling element disposed in contact with the heat dissipation member in the hermetically sealed space, the cooling element having a heat absorbing surface for absorbing heat from the light emitting device and a heat dissipating surface that is in contact with the heat dissipation member to dissipate the heat absorbed by the heat absorbing surface through the heat dissipation member; and a metal plate disposed between the light emitting device and the cooling element, one surface of which is in contact with the heat absorbing surface of the cooling element and the other surface of which is in contact with the light emitting device. The cover film comprises a transparent resin film located outside the hermetically sealed space, and a metal film located inside the hermetically sealed space and including an opening for exposing the light exit surface of the light emitting body to the outside through the resin film. Further, the light emitting device according to the present invention uses the aforementioned cooling system for the light emitting device, and the light emitting body includes a semiconductor light emitting element.

Effects of Invention

The present invention can provide the cooling system for the light emitting device including the light emitting body such as the LED, which can reduce the occurrence of dew condensation around the light emitting device while maintaining the light emitting body at a temperature that is lower that around the light emitting device, and the light emitting device using the cooling system.

DESCRIPTION OF EMBODIMENTS

Hereinafter, the embodiments of the present invention will be described referring to the drawings.

Herein, as a light emitting device to which a cooling system is applied, the cooling system of the present invention will be described by taking an example of a light emitting device where a light emitting body is a semiconductor light emitting element (light emitting diode [LED]).

First Embodiment

First, referring to FIGS. 1 to 3, the cooling system of a light emitting device according to a first embodiment of the present invention will be described.

Figure 1:
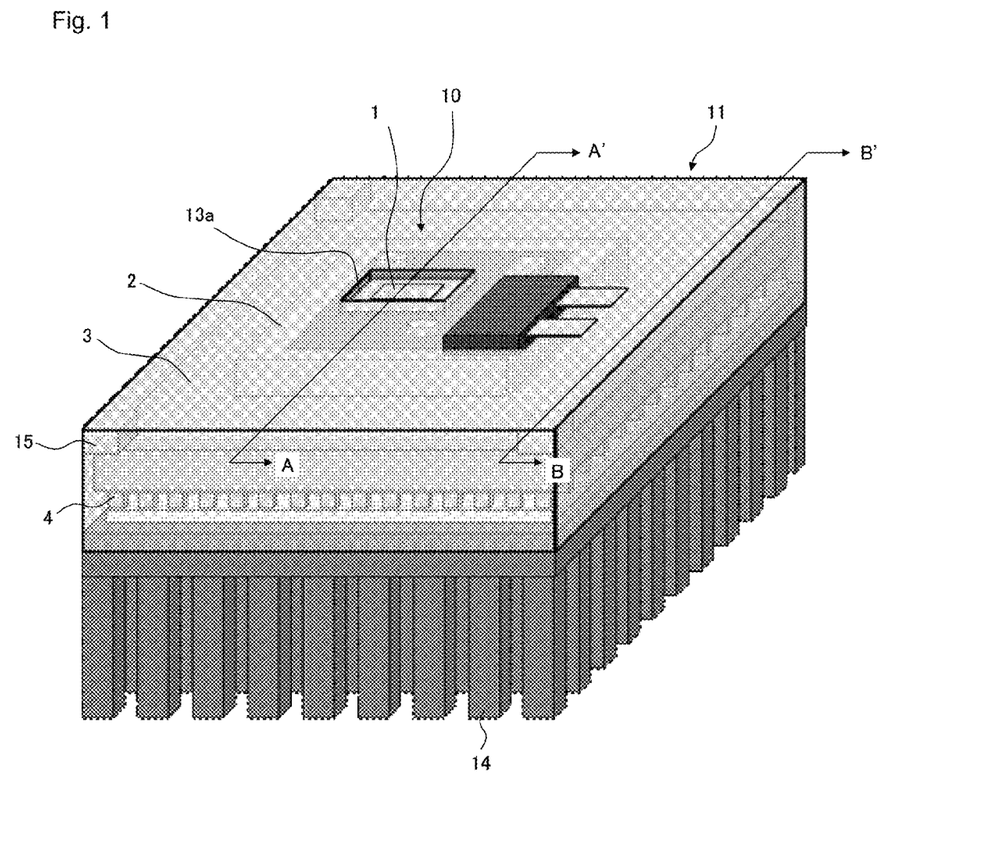
FIG. 1 is a schematic perspective view showing a light emitting device using a cooling system according to a first embodiment of the present invention.

FIG. 1 is a perspective view schematically showing a light emitting device using the cooling system according to this embodiment. FIG. 2 is a schematic sectional view along the line A-A' shown in FIG. 1, and FIG. 3 is a schematic sectional view along the line B-B' shown in FIG. 1.

Figure 2:
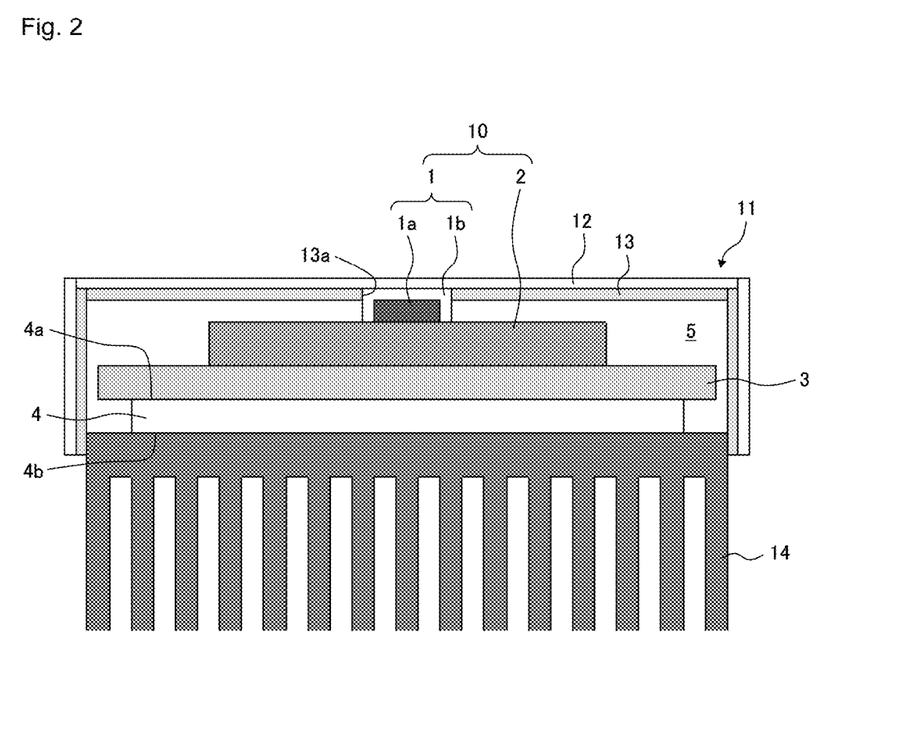
FIG. 2 is a schematic sectional view along the line A-A' shown in FIG. 1.

In the cooling system of this embodiment, as shown in FIGS. 1 and 2, as a cooling element for cooling light emitting device 10 including light emitting body 1, Peltier element 4, namely, a thermoelectric element utilizing the Peltier effect, is used. Light emitting body 1 to be cooled is LED element 1a around which protection member 1b made of glass is placed. LED element 1a is mounted on LED substrate 2 made of metal.

The cooling system of this embodiment includes Peltier element 4, heat sink (heat dissipation member) 14 disposed in contact with heat dissipating surface 4b of Peltier element 4, and cover film 11 that has a double-layered structure fixed to heat sink 14 by an adhesive. The cooling system further includes metal plate 3 disposed between light emitting device 10 and Peltier element 4. As shown in FIG. 2, metal plate 3 is attached to Peltier element 4 such that its bottom surface (one surface) is in contact with heat absorbing surface 4a of Peltier element 4. LED substrate 2 of light emitting device 10 is fixed to the upper surface (other surface) of metal plate 3. In this embodiment, hermetically sealed space 5 defined by heat sink 14 and cover film 11 of the cooling system houses light emitting device 10 to be cooled, metal plate 3, and Peltier element 4.

Peltier element 4 absorbs heat generated during light emission from LED element 1a through LED substrate 2 and metal plate 3, and dissipates the heat from heat sink 5 together with heat generated during driving of Peltier element 4. Accordingly, heat absorbing surface 4a and heat dissipating surface 4b of Peltier element 4 have areas approximately equal to or smaller than the area of the bottom surface of metal plate 3 and larger than the area of the bottom surface (the surface that is in contact with the upper surface of the metal plate) of LED substrate 2. Further, entire heat absorbing surface 4a of Peltier element is in contact with metal plate 3, and the entire bottom surface of LED substrate 2 is in contact with metal plate 3.

Thus, by fixing LED substrate 2 to metal plate 3 that is larger than LED substrate 2 and Peltier element 4, the heat generated at LED element 1a is dispersed at metal plate 3 to be conducted to the entire surface of heat absorbing surface 4a of Peltier element 4. Accordingly, the amount of heat absorbed by heat absorbing surface 4a of Peltier element 4 per unit area can be reduced, and the heat absorbing efficiency of Peltier element 4 can be increased. In this case, to further increase the heat absorbing efficiency of Peltier element 4 by promoting heat dispersion at metal plate 3, it is desirable to use a material such as copper having high heat conductivity for metal plate 3. For example, a flat plate heat pipe can be used.

Cover film 11 comprises resin film 12 having high emissivity and located outside hermetically sealed space 5 and metal film 13 having low emissivity and located inside hermetically sealed space 5. Resin film 12, which is transparent in at least a visible light region, has emissivity equal to or higher than 0.9 in the infrared region of wavelengths 8 μm to 11 μm. According to Wien's displacement law, the infrared region of wavelengths 8 μm to 11 μm corresponds to the range between the permissible temperature and the ambient temperature (environmental temperature) of components of a general electronic device. Metal film 13 made of copper desirably has emissivity equal to or lower than 0.1 in the infrared region of wavelengths 8 μm to 11 μm. Preferably, therefore, metal film 13 has a glossy surface such as aluminum foil. Further, metal film 13 can be made of another metal having such a surface.

Figure 3:
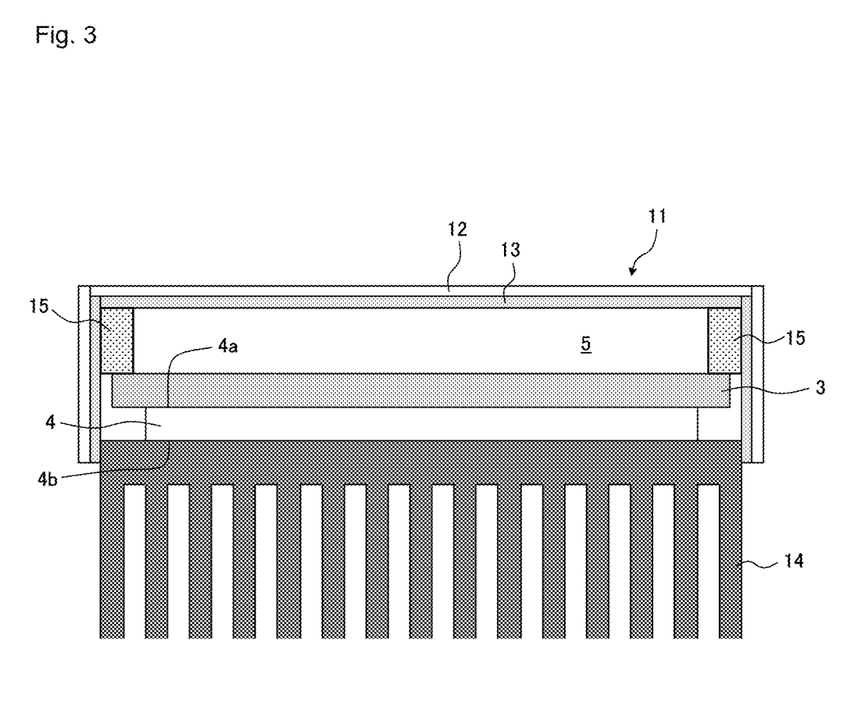
FIG. 3 is a schematic sectional view along the line B-B' shown in FIG. 1.

Resin film 11 fixed to heat sink 4 by the adhesive is, as shown in FIGS. 1 and 3, supported by being in contact with resin guard member 15 disposed in metal plate 3 and light emitting body 1 of light emitting device 10, and defines hermetically sealed space 5 together with heat sink 14. To prevent contact between metal plate 3 and metal film 13, guard member 15 is disposed in metal plate 3 to project outside the side face of metal plate 3. Preferably, to reduce heat conductivity between metal plate 3 and metal film 13, guard member 15 has heat conductivity set equal to or lower than 0.5 W/m·K.

Metal film 13 includes opening 13a formed corresponding to the light exit surface that is the upper surface of light emitting body 1 to expose the light exit surface of light emitting body 1 to the outside through transparent resin film 12 located outside. Accordingly, light emitted from LED element 1a housed in hermetically sealed space 5 can be taken out to the outside.

Air is contained in hermetically sealed space 5. It is desirable to carry out the work of trapping the air in hermetically sealed space 5, in other words, the work of fixing cover film 11 to heat sink 14, in a dry environment. In place of the air, dry gas can be used.

As shown in FIG. 1, terminal 18 for supplying power to LED element 1a in hermetically sealed space 5 is embedded onto cover film 11 by means of an adhesive.

With this configuration, the occurrence of dew condensation in an area outside cover film 11 can be prevented. Its mechanism is as follows.

The peripheral members of LED element 1a, namely, LED substrate 2 and metal plate 3, are set to a temperature lower than the ambient temperature by heat absorption of Peltier element 4. In this case, since cover film 11 is cooled by LED substrate 2 and metal plate 3, the heat is transferred from resin film 12 side located outside hermetically sealed space 5 to metal film 13 side located inside. However, resin film 12, set to a temperature lower than the surrounding air (outside air) by the heat being transferred, can receive heat radiated from the outside air because of high emissivity. Thus, even when the heat is transferred from resin film 12 to inside metal film 13, an increase in the temperature difference between the outside air and resin film 12, especially the surface of resin film 12 exposed to the outside air, can be prevented.

On the other hand, it is difficult for metal film 13 located inside hermetically sealed space 5, while it faces LED substrate 2 and metal plate 3 set to the temperature lower than the ambient temperature, to dissipate the heat captured from resin film 12 to hermetically sealed space 5 because of low emissivity of metal film 13. In other words, it is difficult for metal film 13 to transfer the heat to LED substrate 2 or metal plate 3. In addition, metal film 13 that has the low emissivity is in contact with the light exit surface of light emitting body 1, and therefore can diffuse the heat received by resin film 12 from LED element 1a in cover film 11.

Thus, by cooperative work between resin film 12, that prevents an increase in the temperature difference between the surrounding air (outside air) and resin film 12, and metal film 13 that prevents a decrease in the temperature of cover film 11, the temperature difference between the outside air and cover film 11 exposed to the outside air can be minimized. As a result, the occurrence of dew condensation on the outside surface of cover film 11 can be prevented.

Thus, according to the cooling system of this embodiment, by minimizing the temperature difference between the outside air and cover film 11 exposed to the outside air, the occurrence of dew condensation on the outside surface of cover film 11 can be prevented. The peripheral members of LED element 1a cooled by Peltier element 4 are heat-insulated from the outside air by the air contained in hermetically sealed space 5 and cover film 11. This improves the heat absorbing performance of Peltier element 4, enabling a reduction of power necessary for cooling. The cooling system of this embodiment does not hamper light emission from light emitting body 1 because the light exit surface of light emitting body 1 is exposed to the outside through transparent resin film 12.

Second Embodiment

Next, a cooling system for a light emitting device according to a second embodiment of the present invention will be described.

Figure 4:
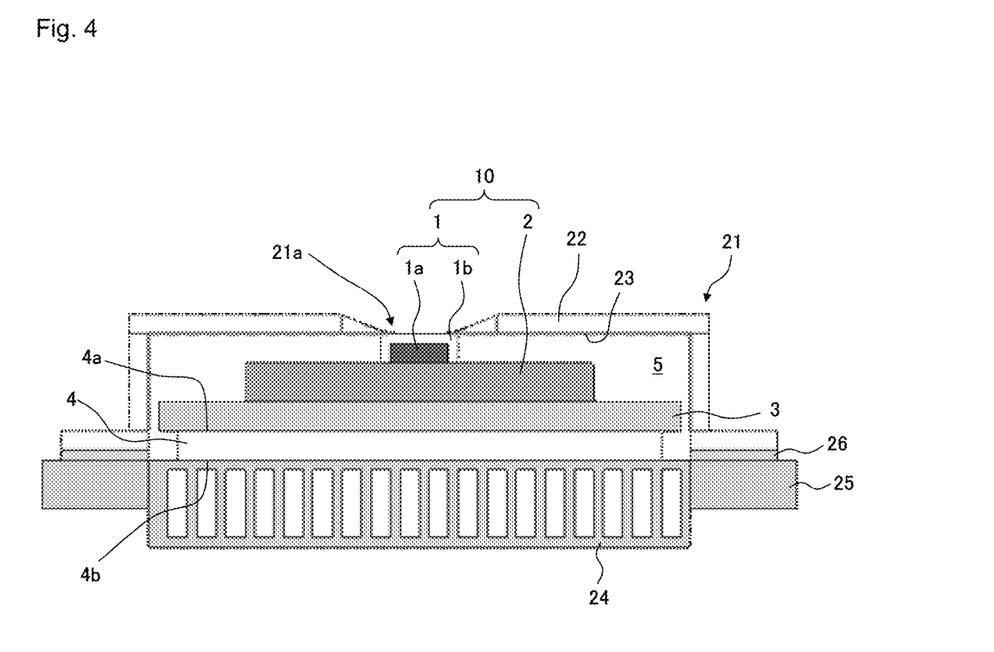
FIG. 4 is a schematic sectional view showing a light emitting device using a cooling system according to a second embodiment of the present invention.

FIG. 4 is a sectional view schematically showing a light emitting device using the cooling system according to this embodiment, corresponding to FIG. 2.

The cooling system of this embodiment is a modified example of the first embodiment where the configuration of members defining hermetically sealed space 5 is changed. In this embodiment, in place of cover film 11 and heat sink 14 of the first embodiment, cover member 21 and water-cooling cold plate 24 are provided. Other components are similar to those of the first embodiment, and effects provided by this embodiment are also similar to those of the first embodiment. Hereinafter, members similar to those of the first embodiment are denoted by similar reference numerals, and description thereof will be omitted.

Cold plate 24 integrated with metal fixed plate 25 is disposed in contact with heat dissipating surface 4b of Peltier element 4. Cover member 21 having a double-layered structure is fixed to fixed plate 25 via flexible rubber member 26 to cover light emitting device 10, metal plate 3, and Peltier element 4.

Cover member 21 comprises resin member 22 located outside hermetically sealed space 5 and having emissivity equal to or higher than 0.9 in the infrared region of wavelengths 8 μm to 11 μm, and aluminum foil 23 located inside hermetically sealed space 5 and disposed on the inner wall of resin member 22. In place of aluminum foil 23, a metal film having a glossy surface can be used. Alternatively, a metal film having emissivity equal to or lower than 0.1 in the infrared region of wavelengths 8 μm to 11 μm can be used.

Cover member 21 includes exit opening 21a formed to expose the light exit surface of light emitting body 1. Exit opening 21a is formed into a tapered shape corresponding to the optical path of light from light emitting body 1 such that its opening diameter becomes larger with increasing distance from light emitting body 1. This enables taking-out of light emitted from LED element 1 housed in hermetically sealed space 5 to the outside. The opening edge of exit opening 21a can be secured to the light exit surface of light emitting body 1 by adjusting the thickness of rubber member 26 that is located between resin member 22 and fixed plate 25. As a result, hermetically sealed space 5, where light emitting device 10, metal plate 3, and Peltier element 4 are housed and where air is contained, is formed.

According to this embodiment, in the above-described mechanism for preventing the occurrence of dew condensation, the opening edge of exit opening 21a absorbs a part of the heat generated at LED element 1, and the heat is diffused in cover member 21 by aluminum foil 15.

Third Embodiment

Figure 5:
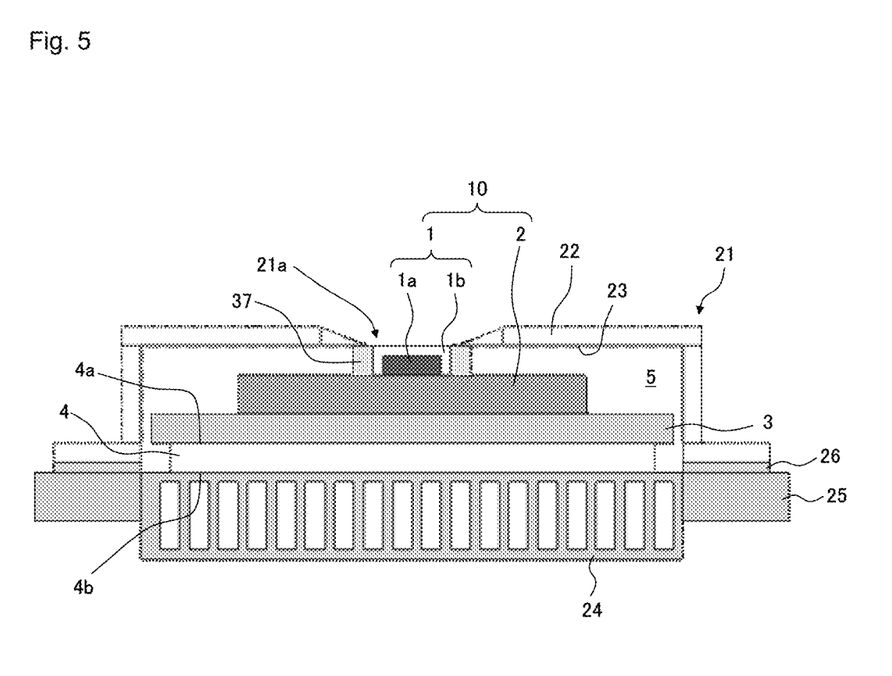
FIG. 5 is a schematic sectional view showing a light emitting device using a cooling system according to the third embodiment of the present invention.

FIG. 5 is a sectional view schematically showing a light emitting device using a cooling system according to a third embodiment of the present invention, corresponding to FIG. 2.

This embodiment is a modified example of the second embodiment where ring member 37 is added to surround light emitting body 1. Ring member 37 is fixed onto LED substrate 2 that is in contact with light emitting body 1. In this embodiment, the opening edge of exit opening 21a is secured to the upper surface of ring member 37 by an adhesive or the like, thereby forming hermetically sealed space 5. Preferably, in the above-described mechanism for preventing the occurrence of dew condensation, to improve heat conduction between light emitting body 1 and cover member 12, ring member 37 is made of a heat-conductive resin or a metal.

In place of cover member 21 of this embodiment, the cover film of the first embodiment where the openings are formed not only in the metal film but also in the resin film can be used. In this case, the resin film does not need to be transparent. Further, in place of cold plate 24 of this embodiment, the heat sink of the first embodiment can be used.

While the present invention has been described with reference to the embodiments, the present invention is not limited to the embodiments described above. It will be understood by those skilled in the art that various changes in form and details may be made therein without departing from the scope of the present invention as defined by the claims.

The present application is based upon and claims the benefit of priority from Japanese Patent Application No. 2010-049047 filed on Mar. 5, 2010, the disclosure of which is incorporated herein in its entirety by reference.

EXPLANATION OF REFERENCE NUMERALS

1 Light emitting element
1a LED element
3 Metal plate
4 Peltier element
4a Heat absorbing surface
4b Heat dissipating surface
5 Hermetically sealed space
11 Cover film
12 Resin film
13 Metal film
13a Opening
4 Heat sink
15 Guard member
21 Cover member
21a Exit opening
22 Resin member
23 Aluminum foil
24 Cold plate
37 Ring member

The invention claimed is:

1. A cooling system for a light emitting device including a light emitting body, comprising:
   a hermetically sealed space in which air is contained and the light emitting device is housed, the hermetically sealed space defined by a heat dissipation member and a cover film having a double-layered structure fixed to the heat dissipation member;
   a cooling element disposed in contact with the heat dissipation member in the hermetically sealed space, the cooling element having a heat absorbing surface for absorbing heat from the light emitting device and a heat dissipating surface that is in contact with the heat dissipation member to dissipate the heat absorbed by the heat absorbing surface through the heat dissipation member; and
   a metal plate disposed between the light emitting device and the cooling element, one surface of which is in contact with the heat absorbing surface of the cooling element and the other surface of which is in contact with the light emitting device,
   wherein the cover film comprises a transparent resin film located outside the hermetically sealed space, and a metal film located inside the hermetically sealed space and including an opening for exposing a light exit surface of the light emitting body to the outside through the resin film.

2. A cooling system for a light emitting device including a light emitting body, comprising:
   a hermetically sealed space in which air is contained and the light emitting device is housed, the hermetically sealed space defined by a heat dissipation member and a cover member having a double-layered structure fixed to the heat dissipation member;
   a cooling element disposed in contact with the heat dissipation member in the hermetically sealed space, the cooling element having a heat absorbing surface for absorbing heat from the light emitting device and a heat dissipating surface that is in contact with the heat dissipation member to dissipate the heat absorbed by the heat absorbing surface through the heat dissipation member; and
   a metal plate disposed between the light emitting device and the cooling element, one surface of which is in contact with the heat absorbing surface of the cooling element and the other surface of which is in contact with the light emitting device, wherein:
   the cover member includes an exit opening formed to expose a light exit surface of the light emitting body to the outside and hermetically sealed by the light emitting device; and
   the cover member comprises a resin member located outside the hermetically sealed space, and a metal film located inside the hermetically sealed space.

3. The cooling system for the light emitting device according to claim 2, wherein an opening edge of the exit opening is secured to the light exit surface of the light emitting body.

4. The cooling system for the light emitting device according to claim 2, wherein:
   the light emitting device further includes a ring member disposed in contact with the light emitting body to surround the light emitting body; and
   an opening edge of the exit opening is secured to the ring member.

5. The cooling system for the light emitting device according to claim 4, wherein the resin member is formed as a film.

6. The cooling system for the light emitting device according to claim 1, further comprising a resin guard member disposed in the metal plate and projected outside a side face of the metal plate to prevent contact between the metal plate and the metal film.

7. The cooling system for the light emitting device according to claim 1, wherein the one surface of the metal plate is in contact with the entire heat absorbing surface of the cooling element, and the other surface is in contact with an entire contact surface of a metal substrate of the light emitting device.

8. The cooling system for the light emitting device according to claim 1, wherein the cooling element is a thermoelectric element using a Peltier effect.

9. A light emitting device using the cooling system for the light emitting device according to claim 1,
   the light emitting body including a semiconductor light emitting element.

10. The cooling system for the light emitting device according to claim 2, further comprising a resin guard member disposed in the metal plate and projected outside a side face of the metal plate to prevent contact between the metal plate and the metal film.

11. The cooling system for the light emitting device according to claim 2, wherein the one surface of the metal plate is in contact with the entire heat absorbing surface of the cooling element, and the other surface is in contact with an entire contact surface of a metal substrate of the light emitting device.

12. The cooling system for the light emitting device according to claim 2, wherein the cooling element is a thermoelectric element using a Peltier effect.

13. A light emitting device using the cooling system for the light emitting device according to claim 2,
   the light emitting body including a semiconductor light emitting element.

14. The cooling system for the light emitting device according to claim 3, further comprising a resin guard member disposed in the metal plate and projected outside a side face of the metal plate to prevent contact between the metal plate and the metal film.

15. The cooling system for the light emitting device according to claim 4, further comprising a resin guard member disposed in the metal plate and projected outside a side face of the metal plate to prevent contact between the metal plate and the metal film.

16. The cooling system for the light emitting device according to claim 5, further comprising a resin guard member disposed in the metal plate and projected outside a side face of the metal plate to prevent contact between the metal plate and the metal film.

17. The cooling system for the light emitting device according to claim 3, wherein the one surface of the metal plate is in contact with the entire heat absorbing surface of the cooling element, and the other surface is in contact with an entire contact surface of a metal substrate of the light emitting device.

18. The cooling system for the light emitting device according to claim 4, wherein the one surface of the metal plate is in contact with the entire heat absorbing surface of the cooling element, and the other surface is in contact with an entire contact surface of a metal substrate of the light emitting device.

19. The cooling system for the light emitting device according to claim 5, wherein the one surface of the metal plate is in contact with the entire heat absorbing surface of the cooling element, and the other surface is in contact with an entire contact surface of a metal substrate of the light emitting device.

20. The cooling system for the light emitting device according to claim 6, wherein the one surface of the metal plate is in contact with the entire heat absorbing surface of the cooling element, and the other surface is in contact with an entire contact surface of a metal substrate of the light emitting device.

* * * * *